United States Patent [19]

Buzzelli

[11] Patent Number: 5,650,615
[45] Date of Patent: Jul. 22, 1997

[54] ELECTROMAGNETIC EMISSION SHIELDING OF AN IMAGE APERTURE OPENING FOR A DIGITAL SCANNER

[75] Inventor: John T. Buzzelli, Walworth, N.Y.

[73] Assignee: Xerox Corporation, Stamford, Conn.

[21] Appl. No.: 520,630

[22] Filed: Aug. 29, 1995

[51] Int. Cl.[6] ............................................. H01J 3/14
[52] U.S. Cl. ................. 250/237 R; 250/239; 174/35 MS
[58] Field of Search .................... 250/237 R, 551, 250/229, 239; 174/35 MS, 35 GC; 219/740–743, 729; 359/13; 360/114

[56] References Cited

U.S. PATENT DOCUMENTS

| | | |
|---|---|---|
| 4,010,343 | 3/1977 | Tanaka et al. .................... 174/35 MS |
| 5,053,924 | 10/1991 | Kurgan ........................... 174/35 GC |
| 5,164,543 | 11/1992 | Benson et al. ..................... 174/35 MS |

*Primary Examiner*—Que Le
*Attorney, Agent, or Firm*—Micheal J. Nickerson

[57] ABSTRACT

A system for preventing the escape of electromagnetic emissions includes a metallic electromagnetic shield. The electromagnetic shield is placed substantially around an electronic subsystem. The metallic electromagnetic shield has an aperture opening to allow light reflected from an image to be incident upon a photosensor of the electronic subsystem. An aperture electromagnetic shield is placed over the aperture opening to allow light to pass therethrough and to reduce or eliminate electromagnetic emissions from escaping through the aperture opening.

7 Claims, 3 Drawing Sheets

ELECTROMAGNETIC EMISSION SHIELDING OF AN IMAGE APERTURE OPENING FOR A DIGITAL SCANNER

FIELD OF THE PRESENT INVENTION

The present invention is directed to electromagnetic emission shielding for a digital scanner. More specifically, the present invention is directed to an electromagnetic emission shield for an image aperture opening in a digital scanner.

BACKGROUND OF THE PRESENT INVENTION

Conventionally, low volume and mid-volume copiers and image input terminals utilize moving scanning carriages to scan an image. These moving scanning carriages usually include an illumination device like a fluorescent lamp. These scanning carriages are moved across an image by a cable system during the scanning process. Such a prior art scanning carriage system is illustrated in FIG. 1. This scanning system is commonly called a half rate/full rate scanning system.

In FIG. 1, a motor 1 in conjunction with a belt 3 is used to drive a capstan 5. Capstan 5 has a plurality of cable windings around it such that when the capstan 5 is rotated, certain cable strands are pulled onto the capstan and other cable strands are released from the capstan. As illustrated in FIG. 1, two sets of cables 11 and 13 are used to move a lamp carriage 17 and a mirror carriage 19 having corner mirrors 21 positioned thereon.

Cable 11 is connected to the frame 9 by anchor 10. The cable 11 is then wrapped around pulley (roller) 57 and connected to the lamp carriage 17 through clamp 28. From clamp 28, cable 11 is wrapped around pulleys (rollers) 51 and 50 before being wrapped around capstan 5. The remaining portion of cable 11 wraps around pulleys (rollers) 55, 60, 58, and 59 before being connected to spring 8. Spring 8 is connected to the frame 9 by anchor 6. Cable 11 is connected to the mirror carriage 19 at pulleys (rollers) 57 and 58.

Cable 13 is connected to the frame 9 by anchor 2. The cable 13 is then wrapped around pulley (roller) 52 and connected to the lamp carriage 17 through clamp 27. From clamp 27, cable 13 is wrapped around pulley (roller) 50 before being wrapped around capstan 5. The remaining portion of cable 13 wraps around pulleys (rollers) 54, 53, and 56 before being connected to spring 4. Spring 4 is connected to the frame 9 by anchor 6. Cable 13 is connected to the mirror carriage 19 at pulleys (rollers) 52 and 53.

The cables 11 and 13 are wrapped around the pulleys (rollers) in such a configuration that when the cables 11 and 13 are released or pulled onto the capstan 5, the carriages 17 and 19 are properly moved to scan the image. More specifically, a lamp 15 which is located on the lamp carriage 17 provides a light source to scan the image wherein the light reflected from the image is incident upon mirrors located on the lamp carriage 19 and thus are directed toward corner mirrors 21 located on the mirror carriage 19. The corner mirrors 21 direct the reflected light from the mirror on the lamp carriage 19 to a lens. The lens focuses the scanned image onto a CCD or full width array sensor. The sensor converts the reflected light into electrical signals representing the scanned image.

Light reflected from an image as noted above, is incident upon a mirror which is located on the lamp carriage 17. This mirror then directs the light towards the corner mirrors 21 on the mirror carriage 19 which causes the light to make a 180° turn. The light leaving the corner mirrors 21 is directed to an optical lens assembly which focuses the reflected light upon a CCD or full width array sensor.

The utilization of pulleys on the mirror carriage 19 allows the mirror carriage to move into proper proportion to the movement of the lamp carriage 17. In other words, a focused image is maintained by maintaining a certain fixed optical distance between the image 101 and the lens 107 while the lamp carriage 17 is moving. The fixed optical length is ensured by the mirror carriage 19 moving at exactly one half the speed of the lamp carriage 17 and in the same direction as the lamp carriage 17.

As noted above with respect to FIG. 1, the light reflected from the mirror carriage 19 is directed to a CCD sensor which converts the light into electrical signals. The CCD sensor is part of an electronic subassembly of the digital scanner which converts the light into electrical image data in such a form that the image data can be utilized by other devices, such as a workstation or printer to either manipulate the electronic image or print the image onto a recording medium so as to produce a hard copy of the image. The frame of electronic subassembly of a conventional digital scanner is illustrated in FIG. 2.

In FIG. 2, an electronic board 4 is utilized to provide physical support and electrical connections between the various electronic components such as a CCD sensor 3 which are utilized to convert the reflected light of the image into electronic image data that can be utilized by a host device such as a personal computer, computer server, or printer. Since the electronic components of this subassembly produce electromagnetic emissions during their operations, an electromagnetic emission shield 2 ("EME shield") is provided over the electronic circuit boards 4 and the CCD sensor 3 so that the electromagnetic emissions can be confined to the volume within the shield and do not travel to adjacent devices, thereby affecting the electronic operation of these devices.

A significant problem with electronic devices is electromagnetic emissions which can adversely affect adjacent electronic equipment through the generation of unwanted electrical noise in the adjacent device. This is specifically a concern with communication equipment which is very sensitive to stray electromagnetic emissions. Electromagnetic emissions are regulated by government agencies such as FCC in the United States. Thus, to prevent this unwanted emission, conventional digital scanner included the EME shield 2 around the electronic assembly. However, the EME shield 2 also includes an aperture opening 1 which allowed the light reflected from the image to travel unobstructed from the corner mirror to the CCD sensor 3.

A problem associated with this conventional design is that not all the electromagnetic emissions are confined to the volume within the boundaries of the EME shield 3. More specifically, a majority of the electromagnetic emissions from the electronic components of the digital scanner escape through the image aperture opening 1. The electromagnetic emissions which escape through the image aperture opening 1 can then adversely affect the electronic operations of adjacent digital machines. Thus, the image aperture opening 1 within the electromagnetic emission shield 2 diminishes the integrity of the electromagnetic emissions shield 2 such that undesirable electromagnetic emissions escape to the surrounding atmosphere, thereby affecting adjacent digital machines.

Therefore, it is desirable to provide electromagnetic emission shielding for a digital scanner which substantially eliminates the escape of undesirable electromagnetic emissions through the image aperture opening while maintaining an unobstructed optical path between the corner mirror of a half rate/full rate scanning carriage system and the CCD sensor 3.

SUMMARY OF THE PRESENT INVENTION

One aspect of the present invention is a system for preventing the escape of electromagnetic emissions. The system includes an electronic subsystem having a photosensor and a metallic electromagnetic shield placed substantially around the electronic subsystem. The metallic electromagnetic shield includes an aperture opening to allow light reflected from an image to be incident upon the photosensor. The system also includes an aperture electromagnetic shield placed over the aperture opening.

Another aspect of the present invention is an electromagnetic emission shielding device. The device includes a metallic electromagnetic shield having an aperture opening to allow light to pass therethrough. The device also includes an aperture electromagnetic shield placed over the aperture opening.

Further objects and advantages of the present invention will become apparent from the following description of the various features of the present invention.

BRIEF DESCRIPTION OF THE DRAWINGS

Following this brief description of each drawing used in describing the present invention, and thus, are being presented for illustrative purposes only and should not be limitative of the scope of the present invention, wherein.

DETAILED DESCRIPTION OF THE PRESENT INVENTION

Figure 1:
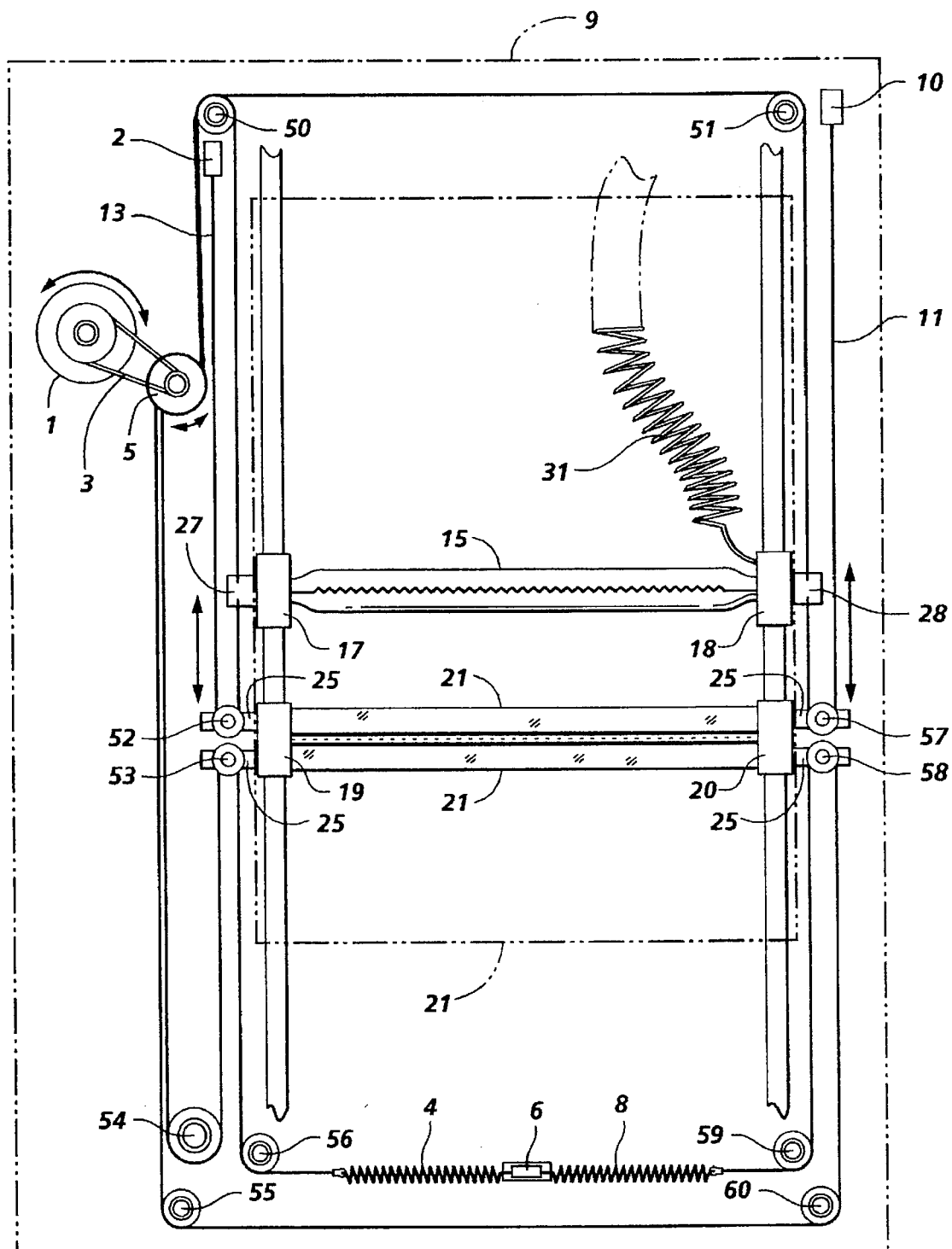
FIG. 1 is a plan view of a half rate/full rate carriage scanning system of a conventional digital copier.

For a general understanding of the present invention, reference is made to the drawings. In the drawings and in the specification, reference numerals have been used throughout to designate identical or equivalent elements or steps.

Figure 3:
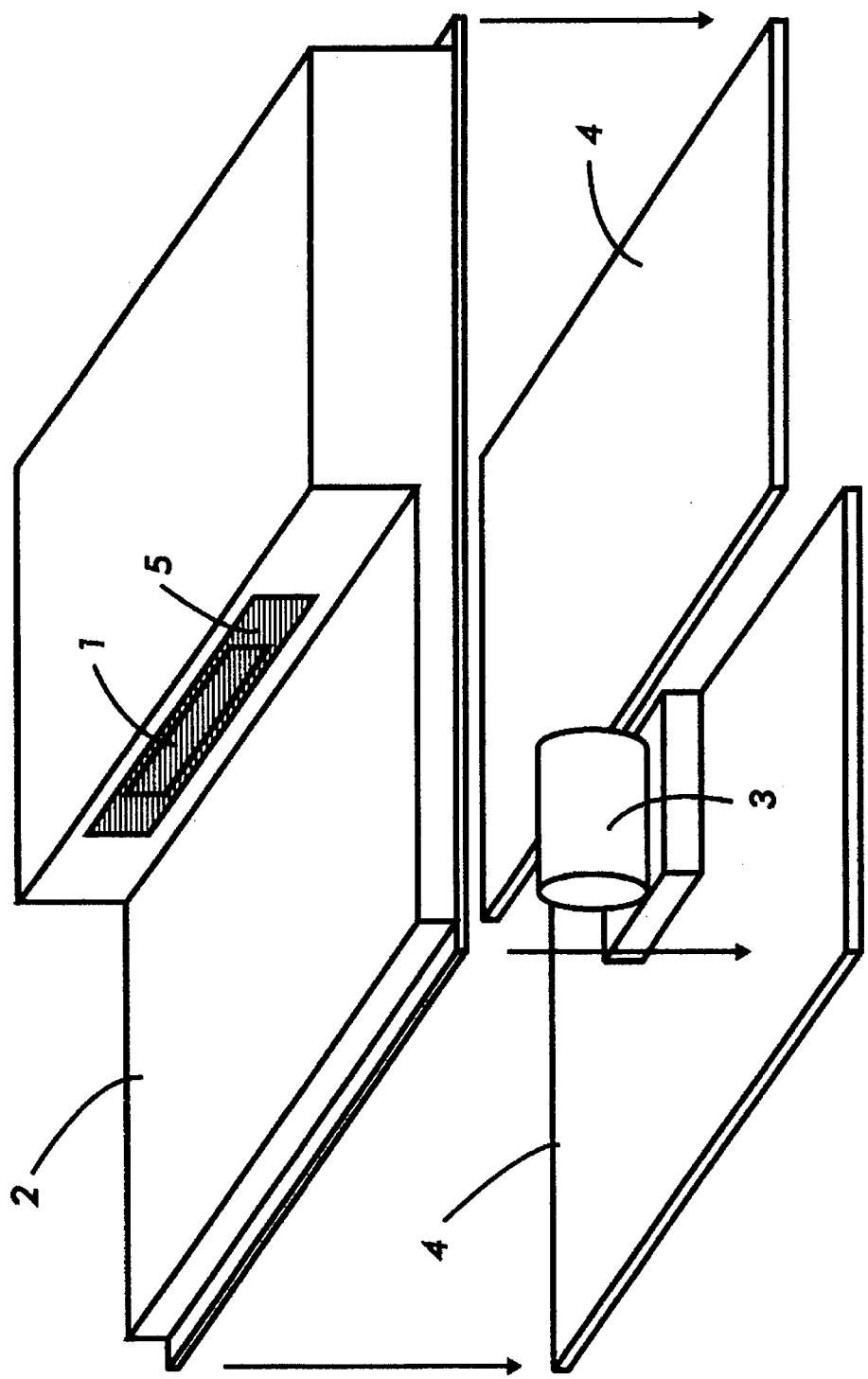
FIG. 3 is a plan view illustrating electromagnetic emission shielding device for a digital scanner according to the present invention.

As noted above, FIG. 3 illustrates an electromagnetic emission shielding device for a digital scanner according to the present invention. As illustrated in FIG. 3, electronic circuit boards 4 are provided to physically support the various electronic components used to convert the light reflected from an image into electrical image data. The electrical circuit boards 4 also provide electrical connections between the various electronic component of the digital scanner.

Figure 2:
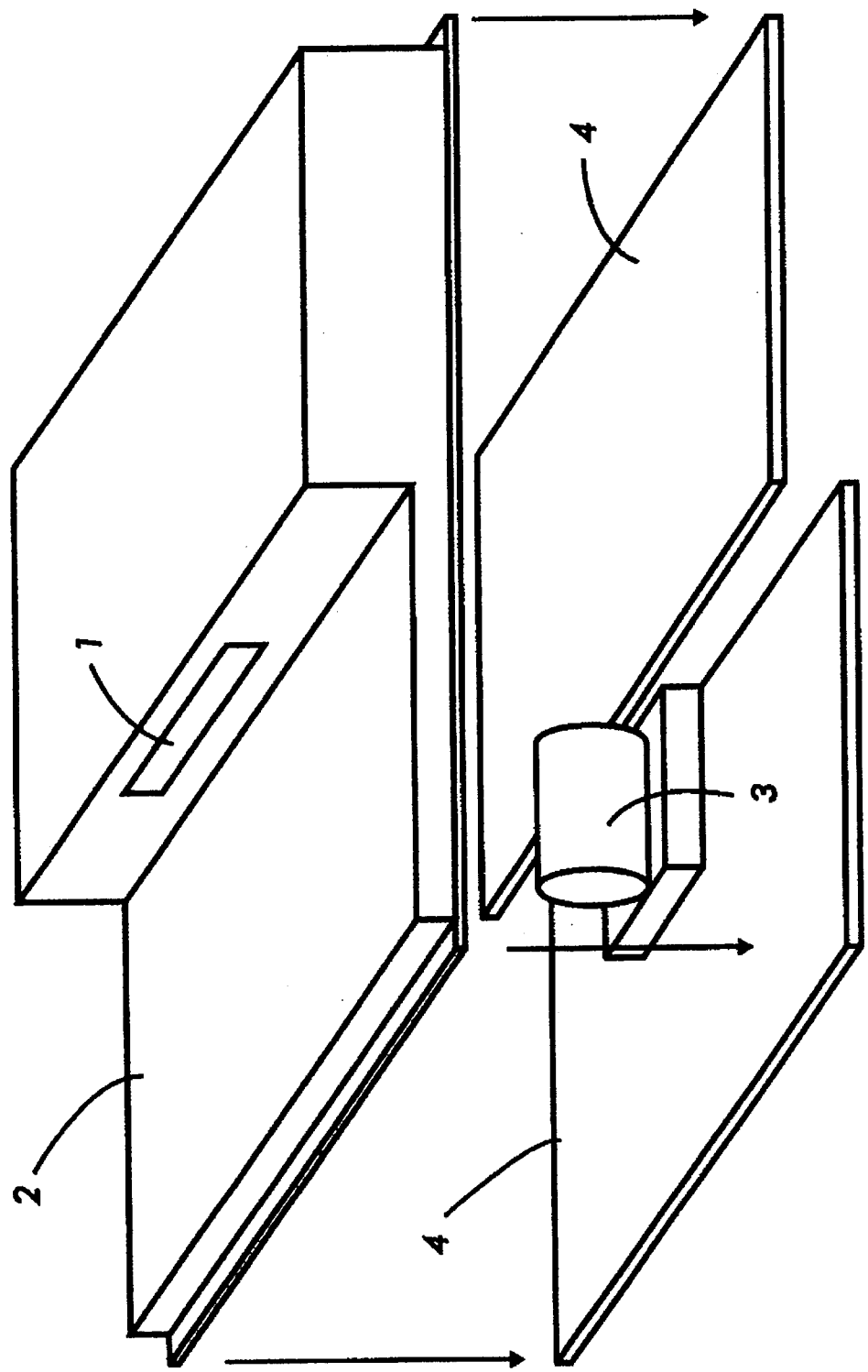
FIG. 2 is a plan view of a conventional electronic subassembly and electromagnetic emission shielding, therefor.

As noted above, the electrical components of the digital scanner produce electromagnetic emissions which can adversely affect the electrical operation of digital machines located adjacent to the digital scanner. To contain, confine, or suppress these electromagnetic emissions, an electromagnetic emission shield 2 is placed over the electronic circuit boards 4. As in the conventional digital scanner illustrated in FIG. 2, the electromagnetic emission shield 2 also includes an image aperture opening 1. Behind the image aperture opening 1 within the electromagnetic emission shield 2, a CCD sensor 3 is located so as to convert the light reflected from the image into electrical signals.

In addition to the electromagnetic emission shield 2, an electromagnetic emission image aperture shield 5 is placed over the image aperture opening and grounded to the electromagnetic emission shield 2 so as to confine or contain any stray electromagnetic emissions to the volume within the electromagnetic emission shield 2. In other words, the aperture screen 5 prevents the escaping of electromagnetic emissions through the image aperture opening 1 of the digital scanner.

The electromagnetic emission screen 5 of the present invention is a metallic screen which is placed over the aperture opening 1 of the electromagnetic emission shield 2 and grounded thereto. The electromagnetic emission screen 5 is placed also in front of the imaging lenses (not shown) which focus the light reflected from the image onto the CCD sensors. This metallic screen is placed outside the focal area of the optical components (lenses) so as to avoid any detrimental degradation of the image's quality. Thus, the metallic screen completely eliminates all known detrimental electromagnetic emissions which would normally escape through the image aperture and avoids degradation of the imaging quality.

In the preferred embodiment of the present invention, the electromagnetic emission aperture shield 5 is an aluminum metallic screen from Sealing Devices, Inc. The screen has a mesh open area of 76% or greater.

However, it is noted that any type of metallic screen may be utilized as an electromagnetic emission aperture shield so long as the magnetic screen provides adequate electromagnetic emission suppression and has a mesh fine enough to provide proper transmittance of the light reflected from the image so as to prevent detrimental degradation of the image quality. For example, if a screen with a greater mesh open area was utilized more light would pass therethrough, but the amount of electromagnetic emissions escaping increases. A smaller mesh open area may be utilized, but the image processing of the image data would need to be adjusted for the lesser amount of light being received through the mesh.

As noted above, the metallic screen should be placed in an area outside of the focal area of the optical components utilized in focusing the light reflected from the image onto the CCDs sensor.

Although the present invention has been described with respect to a CCD sensor, the CCD sensor can be effectively replaced with a full width array sensor.

Moreover, even though the present invention has been described with respect to a half rate/full rate scanning system, it can be utilized in any digital scanning system.

While the present invention has been described with reference to various embodiments as disclosed above, it is not confined to the details set forth above, but is intended to cover such modifications or changes as may come within the scope of the attached claims.

What is claimed is:

1. A digital scanner, comprising:

an illumination source to illuminate an image;

an electronic subsystem, including a photosensitive device sensitive to a predetermined frequency range of light, to convert light reflected from the image into a digital representation;

said electronic subsystem generating undesirable electromagnetic radiation;

a metallic electromagnetic shield placed substantially around said electronic subsystem and said photosensitive device; and said metallic electromagnetic shield including an aperture opening to allow light reflected from the image corresponding to the predetermined frequency range to be incident upon said photosensitive device;

an aperture electromagnetic shield placed over said aperture opening;

said metallic electromagnetic shield and said aperture electromagnetic shield forming a volume substantially around said electronic subsystem to contain substantially all the undesirable electromagnetic radiation therein;

said aperture electromagnetic shield allowing light reflected from the image corresponding to the predetermined frequency range to be incident upon said photosensitive device.

2. The digital scanner as claimed in claim 1, wherein said aperture electromagnetic shield is grounded to said metallic electromagnetic shield.

3. The digital scanner as claimed in claim 1, further comprising:

a lens system to focus the reflected light onto the photosensitive device, said lens system being positioned such that said aperture electromagnetic shield is outside a field of focus of said lens system.

4. The digital scanner as claimed in claim 1, wherein said aperture electromagnetic shield is aluminum.

5. The digital scanner as claimed in claim 1, wherein said aperture electromagnetic shield has a minimum mesh opening area of 76%.

6. The digital scanner as claimed in claim 1, wherein said aperture electromagnetic shield has a mesh opening area of 76%.

7. The digital scanner as claimed in claim 1, wherein said aperture electromagnetic shield is made from an electrical conductive material.

* * * * *